United States Patent
Choi et al.

(10) Patent No.: US 8,231,821 B2
(45) Date of Patent: Jul. 31, 2012

(54) SUBSTRATE ALIGNMENT

(75) Inventors: Byung-Jin Choi, Austin, TX (US); Pawan Kumar Nimmakayala, Austin, TX (US); Mahadevan GanapathiSubramanian, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 237 days.

(21) Appl. No.: 12/610,714

(22) Filed: Nov. 2, 2009

(65) Prior Publication Data

US 2010/0109202 A1    May 6, 2010

Related U.S. Application Data

(60) Provisional application No. 61/111,107, filed on Nov. 4, 2008.

(51) Int. Cl.
 *B29C 59/02* (2006.01)
 *G01B 11/03* (2006.01)

(52) U.S. Cl. ...... 264/409; 264/40.5; 264/293; 264/1.33; 425/385; 425/150; 425/810

(58) Field of Classification Search .............. 264/293, 264/40.1, 40.5, 1.33, 1.7, 409; 425/385, 425/150, 174.4, 810
See application file for complete search history.

(56) References Cited

U.S. PATENT DOCUMENTS

| | | | |
|---|---|---|---|
| 4,569,806 A * | 2/1986 | Holster ...................... | 264/1.33 |
| 4,995,799 A * | 2/1991 | Hayashi et al. .............. | 425/111 |
| 5,527,497 A * | 6/1996 | Kanome et al. ............. | 264/1.33 |
| 6,030,556 A * | 2/2000 | DePuydt et al. ............. | 264/1.37 |
| 6,081,334 A | 6/2000 | Grimbergen et al. | |
| 6,081,990 A * | 7/2000 | Kuroba et al. ............. | 29/603.01 |
| 6,210,609 B1 * | 4/2001 | Takeda et al. ................ | 264/1.33 |
| 6,757,116 B1 | 6/2004 | Curtiss | |
| 6,842,229 B2 | 1/2005 | Sreenivasan et al. | |
| 6,873,087 B1 | 3/2005 | Choi et al. | |
| 6,902,853 B2 | 6/2005 | Sreenivasan et al. | |
| 6,916,584 B2 | 7/2005 | Sreenivasan et al. | |
| 6,921,615 B2 | 7/2005 | Sreenivasan et al. | |
| 6,922,906 B2 | 8/2005 | Choi et al. | |
| 6,936,194 B2 | 8/2005 | Watts | |
| 6,947,244 B2 * | 9/2005 | Kawaguchi et al. ........... | 360/75 |
| 6,954,275 B2 | 10/2005 | Choi et al. | |
| 7,027,156 B2 | 4/2006 | Watts et al. | |
| 7,070,405 B2 | 7/2006 | Sreenivasan et al. | |
| 7,136,150 B2 | 11/2006 | Sreenivasan et al. | |
| 7,170,589 B2 | 1/2007 | Cherala et al. | |
| 7,186,483 B2 | 3/2007 | Sreenivasan et al. | |
| 7,281,921 B2 | 10/2007 | Watts et al. | |
| 7,292,326 B2 | 11/2007 | Nimmakayala et al. | |
| 7,303,383 B1 | 12/2007 | Sreenivasan et al. | |

(Continued)

FOREIGN PATENT DOCUMENTS

WO   WO/03/104898   12/2003

*Primary Examiner* — Joseph Del Sole
*Assistant Examiner* — Nahida Sultana
(74) *Attorney, Agent, or Firm* — Cameron A. King (57) ABSTRACT

Systems and methods for imprinting a patterned layer on a substrate are described. Features of patterned layer may be concentrically imprinted in relation to a shaft positioned on a substrate chuck. The substrate may be biased using a radius difference between a diameter of the shaft and an inner diameter of the substrate in relation to a point on an inner edge of the substrate.

17 Claims, 7 Drawing Sheets

U.S. PATENT DOCUMENTS

| | | | |
|---|---|---|---|
| 7,311,516 B2 * | 12/2007 | Inoue | 425/542 |
| 7,323,130 B2 | 1/2008 | Nimmakayala et al. | |
| 7,670,529 B2 | 3/2010 | Choi et al. | |
| 7,780,893 B2 | 8/2010 | Sreenivasan et al. | |
| 2004/0001266 A1 * | 1/2004 | Kuo et al. | 360/16 |
| 2004/0149687 A1 | 8/2004 | Choi et al. | |
| 2004/0163563 A1 | 8/2004 | Sreenivasan et al. | |
| 2005/0064344 A1 | 3/2005 | Bailey et al. | |
| 2005/0146078 A1 | 7/2005 | Chou et al. | |
| 2005/0173072 A1 | 8/2005 | Mizuta | |
| 2005/0269745 A1 | 12/2005 | Cherala et al. | |
| 2005/0270516 A1 | 12/2005 | Cherala et al. | |
| 2005/0271955 A1 | 12/2005 | Cherala et al. | |
| 2006/0114450 A1 | 6/2006 | Nimmakayala et al. | |
| 2006/0115999 A1 | 6/2006 | Sreenivasan et al. | |
| 2006/0152835 A1 * | 7/2006 | Bandic et al. | 360/17 |
| 2006/0279004 A1 * | 12/2006 | Suehira et al. | 257/797 |
| 2007/0164458 A1 | 7/2007 | Ogino | |
| 2007/0211592 A1 * | 9/2007 | Sakurai et al. | 369/47.49 |
| 2007/0228609 A1 | 10/2007 | Sreenivasan et al. | |
| 2007/0231421 A1 | 10/2007 | Nimmakayala et al. | |
| 2007/0243655 A1 | 10/2007 | Schmid et al. | |
| 2007/0285816 A1 * | 12/2007 | Deeman et al. | 360/16 |
| 2008/0029931 A1 | 2/2008 | Tada et al. | |
| 2008/0153312 A1 | 6/2008 | Sreenivasan et al. | |
| 2008/0233331 A1 | 9/2008 | Thallner | |
| 2009/0026657 A1 | 1/2009 | Nimmakayala et al. | |
| 2009/0147237 A1 | 6/2009 | Schumaker et al. | |
| 2009/0250840 A1 | 10/2009 | Selinidis et al. | |
| 2010/0081010 A1 * | 4/2010 | Tatsugawa et al. | 428/800 |
| 2010/0092599 A1 | 4/2010 | Selinidis et al. | |
| 2011/0053088 A1 * | 3/2011 | Usa et al. | 430/296 |
| 2011/0272096 A1 * | 11/2011 | Serikawa et al. | 156/345.24 |

* cited by examiner

SUBSTRATE ALIGNMENT

CROSS REFERENCE TO RELATED APPLICATIONS

This application claims the benefit under 35 U.S.C. §119 (e)(1) of U.S. Provisional Patent Application No. 61/111,107, filed Nov. 4, 2008, which is hereby incorporated by reference herein in its entirety.

BACKGROUND INFORMATION

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate, therefore nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

An exemplary nano-fabrication technique in use today is commonly referred to as imprint lithography. Exemplary imprint lithography processes are described in detail in numerous publications, such as U.S. Patent Publication No. 2004/0065976, U.S. Patent Publication No. 2004/0065252, and U.S. Pat. No. 6,936,194, all of which are hereby incorporated by reference.

An imprint lithography technique disclosed in each of the aforementioned U.S. patent publications and patent includes formation of a relief pattern in a formable liquid (polymerizable material) and transferring a pattern corresponding to the relief pattern into an underlying substrate. The substrate may be coupled to a motion stage to obtain a desired positioning to facilitate the patterning process. The patterning process uses a template spaced apart from the substrate and a formable liquid applied between the template and the substrate. The formable liquid is solidified to form a rigid layer that has a pattern conforming to a shape of the surface of the template that contacts the formable liquid. After solidification, the template is separated from the rigid layer such that the template and the substrate are spaced apart. The substrate and the solidified layer are then subjected to additional processes to transfer a relief image into the substrate that corresponds to the pattern in the solidified layer.

BRIEF DESCRIPTION OF DRAWINGS

So that the present invention may be understood in more detail, a description of embodiments of the invention is provided with reference to the embodiments illustrated in the appended drawings. It is to be noted, however, that the appended drawings illustrate only typical embodiments of the invention, and are therefore not to be considered limiting of the scope.

DETAILED DESCRIPTION

Figure 1:
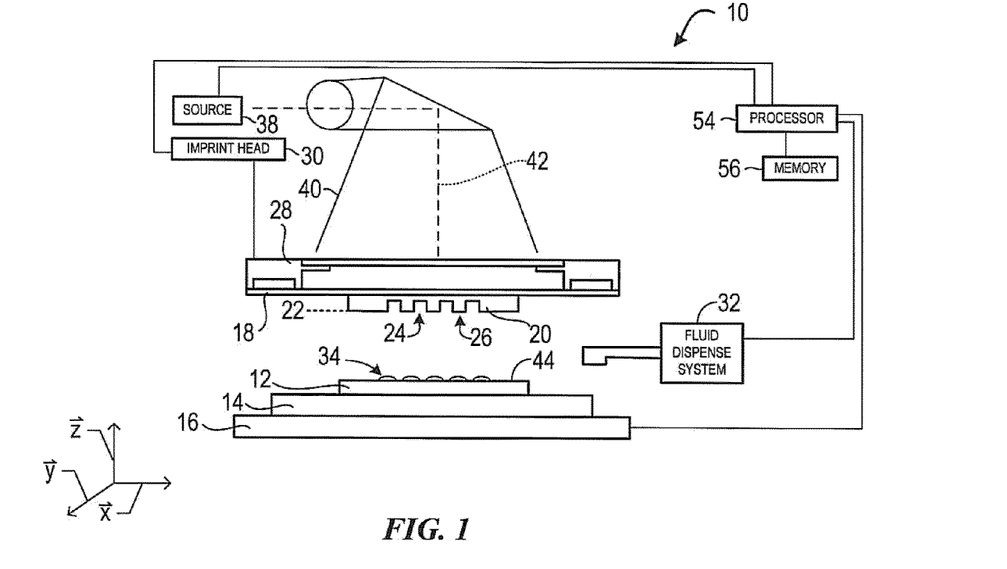
FIG. 1 illustrates a simplified side view of a lithographic system in accordance with one embodiment of the present invention.

Referring to the figures, and particularly to FIG. 1, illustrated therein is a lithographic system 10 used to form a relief pattern on substrate 12. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electromagnetic, and/or the like. Exemplary chucks are described in U.S. Pat. No. 6,873,087, which is hereby incorporated by reference.

Substrate 12 and substrate chuck 14 may be further supported by stage 16. Stage 16 may provide motion along the x-, y-, and z-axes. Stage 16, substrate 12, and substrate chuck 14 may also be positioned on a base (not shown).

Spaced-apart from substrate 12 is a template 18. Template 18 generally includes a mesa 20 extending therefrom towards substrate 12, mesa 20 having a patterning surface 22 thereon. Further, mesa 20 may be referred to as mold 20. Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. As illustrated, patterning surface 22 comprises features defined by a plurality of spaced-apart recesses 24 and/or protrusions 26, though embodiments of the present invention are not limited to such configurations. Patterning surface 22 may define any original pattern that forms the basis of a pattern to be formed on substrate 12.

Template 18 may be coupled to chuck 28. Chuck 28 may be configured as, but not limited to, vacuum, pin-type, groove-type, electromagnetic, and/or other similar chuck types. Exemplary chucks are further described in U.S. Pat. No. 6,873,087, which is hereby incorporated by reference. Further, chuck 28 may be coupled to imprint head 30 such that chuck 28 and/or imprint head 30 may be configured to facilitate movement of template 18.

System 10 may further comprise a fluid dispense system 32. Fluid dispense system 32 may be used to deposit polymerizable material 34 on substrate 12. Polymerizable material 34 may be positioned upon substrate 12 using techniques such as drop dispense, spin-coating, dip coating, chemical vapor deposition (CVD), physical vapor deposition (PVD), thin film deposition, thick film deposition, and/or the like. Polymerizable material 34 may be disposed upon substrate 12 before and/or after a desired volume is defined between mold 20 and substrate 12 depending on design considerations. Polymerizable material 34 may comprise a monomer mixture as described in U.S. Pat. No. 7,157,036 and U.S. Patent Publication No. 2005/0187339, all of which are hereby incorporated by reference.

Figure 2:
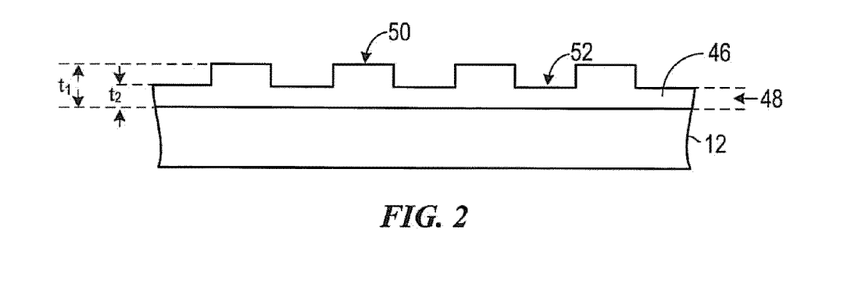
FIG. 2 illustrates a simplified side view of the substrate shown in FIG. 1 having a patterned layer positioned thereon.

Referring to FIGS. 1 and 2, system 10 may further comprise an energy source 38 coupled to direct energy 40 along path 42. Imprint head 30 and stage 16 may be configured to position template 18 and substrate 12 in superimposition with path 42. System 10 may be regulated by a processor 54 in communication with stage 16, imprint head 30, fluid dispense system 32, and/or source 38, and may operate on a computer readable program stored in memory 56.

Either imprint head 30, stage 16, or both vary a distance between mold 20 and substrate 12 to define a desired volume therebetween that is filled by polymerizable material 34. For example, imprint head 30 may apply a force to template 18 such that mold 20 contacts polymerizable material 34. After the desired volume is filled with polymerizable material 34, source 38 produces energy 40, e.g., ultraviolet radiation, causing polymerizable material 34 to solidify and/or cross-link conforming to shape of a surface 44 of substrate 12 and patterning surface 22, defining a patterned layer 46 on substrate 12. Patterned layer 46 may comprise a residual layer 48 and a plurality of features shown as protrusions 50 and recessions 52, with protrusions 50 having thickness $t_1$ and residual layer having a thickness $t_2$.

The above-mentioned system and process may be further employed in imprint lithography processes and systems referred to in U.S. Pat. No. 6,932,934, U.S. Patent Publication No. 2004/0124566, U.S. Patent Publication No. 2004/0188381, and U.S. Patent Publication No. 2004/0211754, each of which is hereby incorporated by reference.

Figure 3:
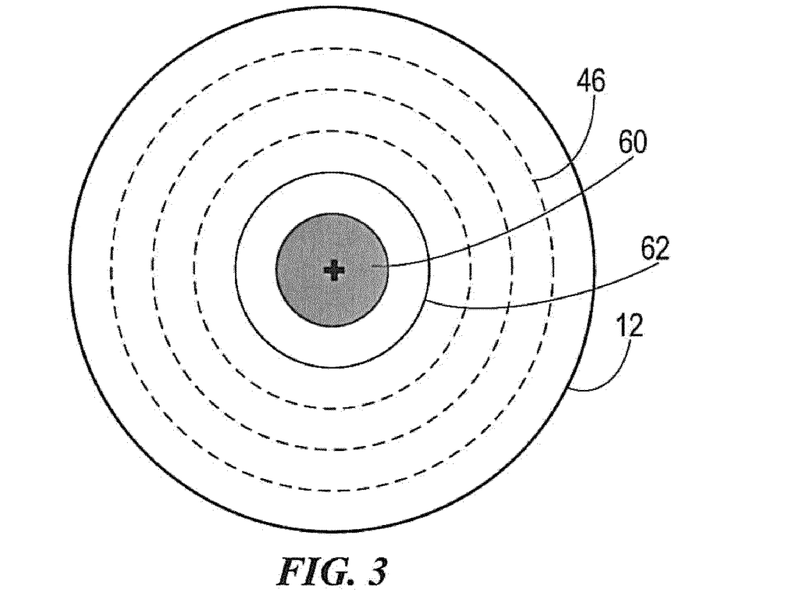
FIG. 3 illustrates a top down view of an exemplary patterned layer on a substrate.

As illustrated in FIG. 3, patterning of substrate 12 to form patterned layer 46 may involve co-centering substrate 12 with a rotating shaft 60. Shaft 60 may be designed similar to a spindle of a hard disk drive. Exemplary spindles are further described in U.S. Pat. No. 6,081,990, which is hereby incorporated by reference in its entirety. In one embodiment, spindles may be formed of similar dimensions and characteristics as shafts 60 as described herein.

Figure 4:
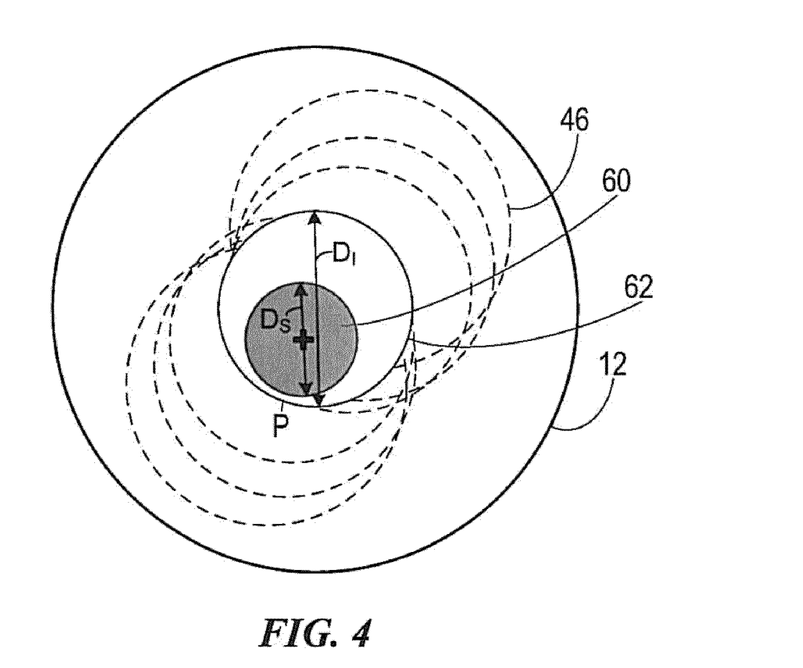
FIG. 4 illustrates a top down view of an exemplary patterned layer on a substrate.

The inner edge 62 of substrate 12 may be substantially centered about shaft 60 such that features of patterned layer 46 may be concentrically imprinted (e.g., con-centering). Shaft 60 and/or substrate 12, however, may have manufacturing variations. Such variations may provide for errors in centering. For example, as illustrated in FIG. 4, shaft 60 may have a reduced size and/or the inner diameter of the substrate 12 may have an increased size resulting in misalignment and a substantially non-circular rotation of substrate 12. Even further, inner diameter of substrate 12 and/or shaft 60 may be non-circular resulting in misalignment and non-circular rotation.

To reduce misalignment, substrate 12 may be biased from at least one point P of the inner edge 62 of substrate 12 by the radius difference $\Delta R$ between the diameter $D_S$ of shaft 60 and the inner diameter $D_I$ of substrate 12.

Point P may be determined using alignment marks and/or gratings in a known theta orientation. Use of alignment marks and/or grating are described in detail in U.S. application Ser. No. 12/175,258, U.S. Pat. No. 6,916,584, U.S. Pat. No. 7,027,156, and U.S. Pat. No. 7,136,150, all of which are hereby incorporated by reference. Alternatively, point P may be determined by a microscope.

Laser Biasing

Figure 5:
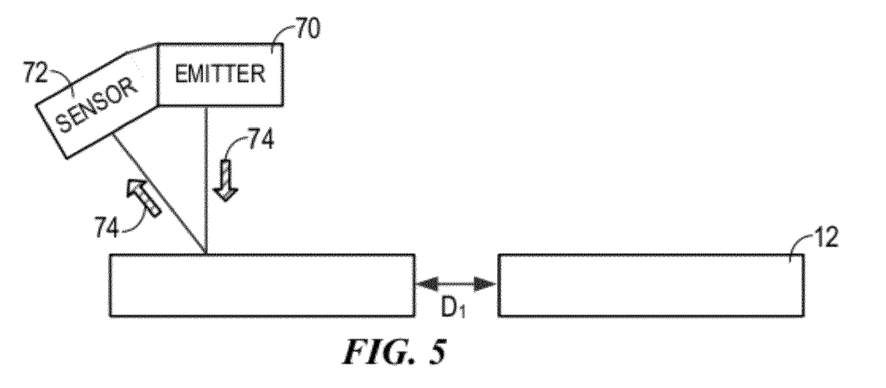
FIG. 5 illustrates a block diagram of an exemplary system for determining the inner diameter of a substrate.

As illustrated in FIG. 5, a laser emitter 70 and a photo-electric detector 72 may be used to determine the inner diameter $D_I$ of substrate 12. The inner diameter $D_I$ of substrate 12 may be determined prior to placement within system 10 and/or after placement within system 10. For example, laser emitter 70 and photo-electric detector 72 may be located above paths of template 18 and substrate 12 within system 10. The photo-electric detector 72 may be placed such that it receives light 74 reflected and/or diffracted at an angle and provides a signal when laser is incident on substrate 12. The signal may be used to determine the inner diameter $D_I$ of substrate 12. For example, a drop or rise in the signal may indicate laser is incident within the inner diameter $D_I$ of substrate 12.

Figure 6:
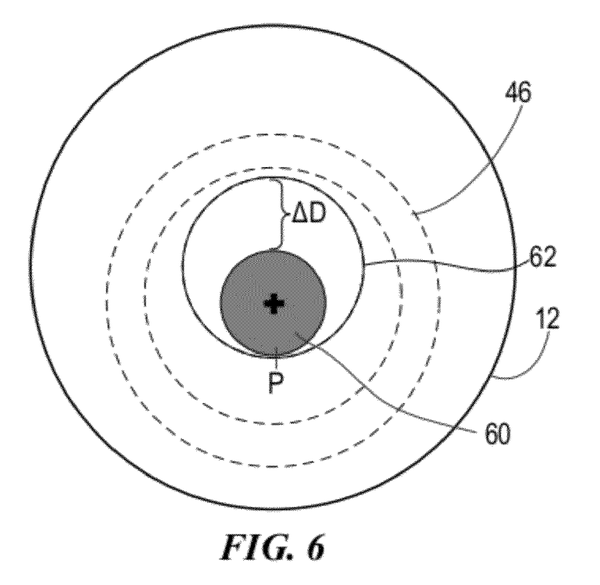
FIG. 6 illustrates a top down view of an exemplary patterned layer on a substrate arranged about a shaft.

Using a known diameter $D_S$ of shaft 60, the radius difference $\Delta R$ between the diameter $D_S$ of shaft 60 and the inner diameter $D_I$ of substrate 12 may be determined. Using the radius difference $\Delta R$, substrate 12 may be positioned and/or repositioned such that patterned features 50 may be concentrically imprinted in relation to shaft 60. For example, substrate 12 may be patterned in the manner in which substrate 12 will be positioned within a disk drive. Point P of inner edge 62 of substrate 12 may be adjacent to shaft 60, while a portion of the inner edge 62 of substrate 12 may be positioned a distance equal to $\Delta R$ from shaft 60, as illustrated in FIG. 6. Accounting for this positioning, substrate 12 may be patterned by template 18 (shown and described in relation to FIG. 1) to provide the concentrically imprinted patterned layer 46. It should be noted that the positioning may be such that the concentrically imprinted patterned layer 46 may not be centered on substrate 12.

Figure 7:
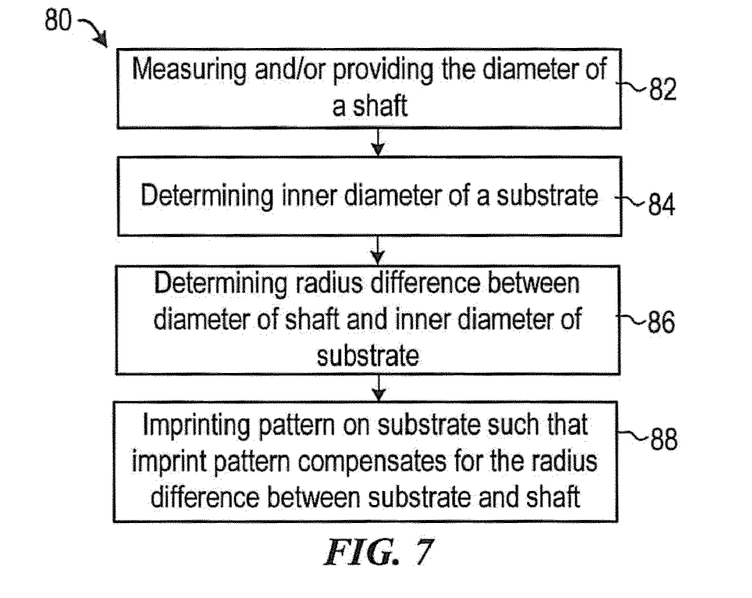
FIG. 7 illustrates a flow chart of an exemplary method for providing patterned features on substrate in a concentric arrangement in relation to a shaft.

FIG. 7 illustrates a flow chart of an exemplary method 80 for providing patterned features 50 and 52 on substrate 12 in a concentric arrangement in relation to shaft 60. In a step 82, diameter $D_S$ of shaft 60 may be measured and/or provided. In a step 84, the inner diameter $D_I$ of substrate 12 may be determined. For example, the inner diameter $D_I$ of substrate 12 may be determined by photo-electric detector 72 and laser emitter 70. In a step 86, the radius difference $\Delta R$ may be determined. In a step 88, substrate 12 may imprinted by template 18 in system 10 such that the imprint pattern accounts for at least one point P of the inner edge 62 of substrate 12 being adjacent to shaft 60, while at least a portion of the inner edge 62 is positioned a distance $\Delta R$ from shaft 60.

Mechanical Bias

Referring to FIGS. 8-11, stabilizers 74 may be placed about substrate 12 within system 10. Stabilizers 74 may reinforce positioning that compensates for the positioning of substrate 12 on spindle of a hard disk drive. Stabilizers 74 may be considered a type of shaft 60 and/or used in conjunction with shaft 60 depending on design considerations.

Stabilizers 74 may be placed adjacent to the outer edge 76 of substrate 12 and/or the inner edge 62 of substrate 12. One or more stabilizers 74 may be moveable. Moveable stabilizers 74 may be capable of adjustment to provide for loading and unloading of substrate 12 to and/or from system 10.

Figure 8:
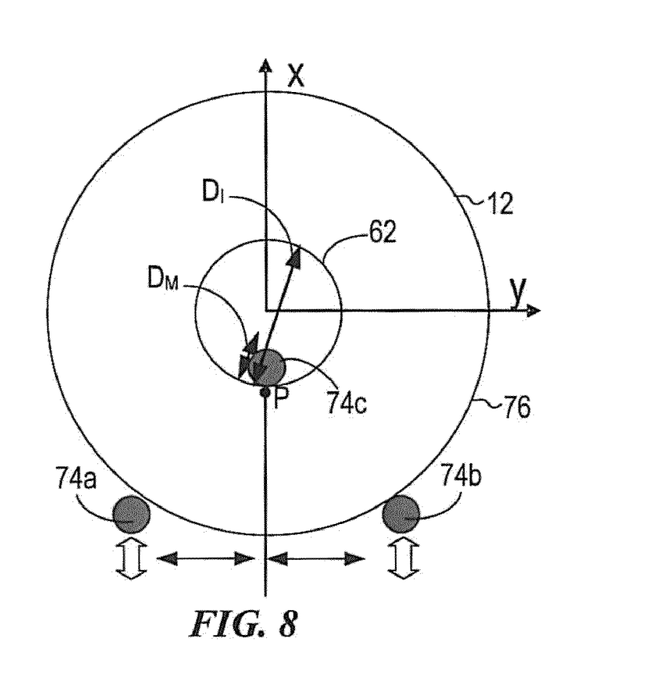
FIGS. 8-13 illustrate exemplary stabilizers for use in the system illustrated in FIG. 1.
Figure 9:
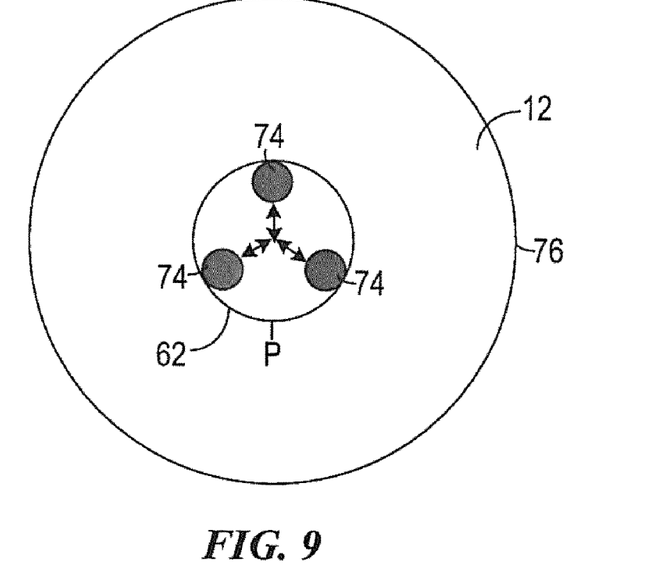
Figure 10:
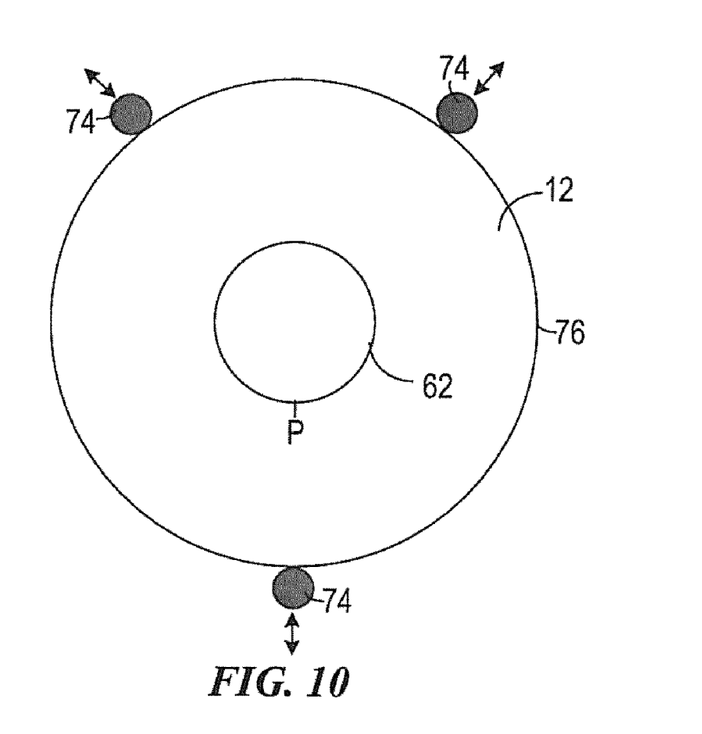

Generally, stabilizers 74 may provide for at least three points of contact on substrate 12. For example, as illustrated in FIG. 8, two stabilizers 74 may be placed adjacent to the outer edge 76 of substrate 12 with one stabilizer 74 on the inner edge 62 of substrate 12. In another embodiment, as illustrated in FIG. 9, three stabilizers 74 may be place on the inner edge 62 of substrate 12. In a similar fashion, as illustrated in FIG. 10, three stabilizers 74 may be place on the outer edge 76 on substrate 12.

Figure 11:
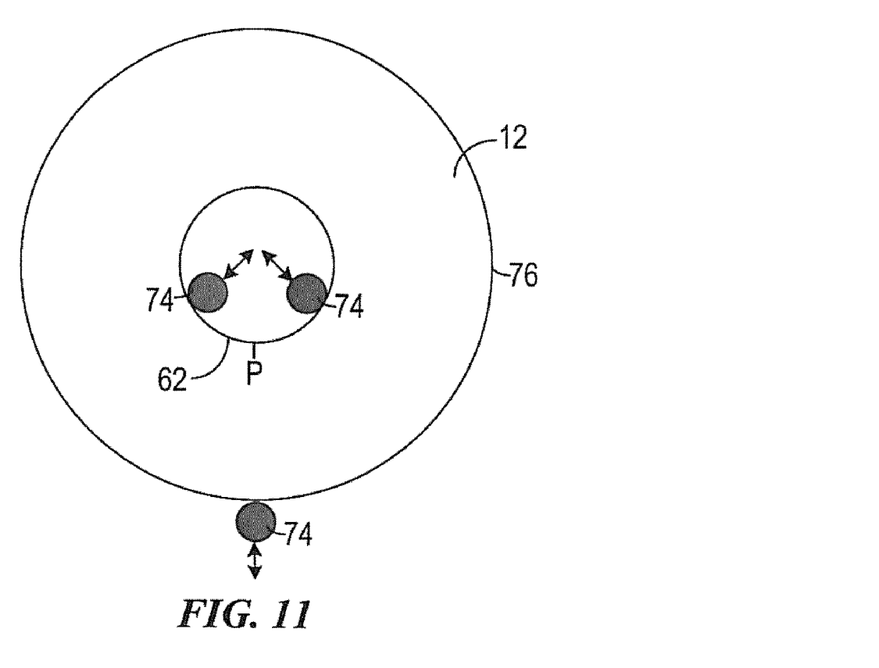
Figure 12:
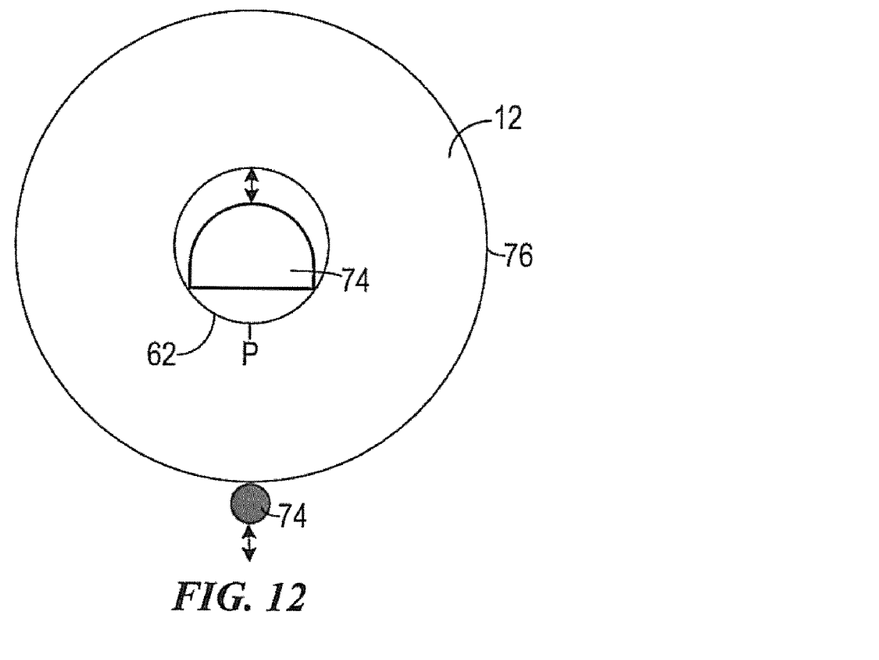

In another example, as illustrated in FIG. 11, one stabilizer 74 may be placed adjacent to the outer edge 76 of substrate 12 with two stabilizers 74 on the inner edge 62 of substrate 12. Alternatively, as illustrated in FIG. 12, a single stabilizer 74 may be able to provide two or more points of contact on the inner edge 62 of substrate 12 with an additional stabilizer 74 adjacent on the outer edge 76 of substrate 12.

Stabilizers 74 may be integral or attachable to substrate chuck 14 and/or stage 16 (shown in FIG. 1). Generally, position of stabilizers 74 may be pre-determined depending on the determination of point P on substrates. For example, in FIG. 8, stabilizers 74a and 74b may be located equidistant from stabilizer 74c.

In an exemplary embodiment, at least one stabilizer 74 may be formed having dimensions comparable to a spindle and/or shaft 60. For example, shaft stabilizer 74 may be formed having a slightly smaller diameter $D_M$ than the inner diameter $D_I$ of substrate 12 (e.g., ~19.9 mm for $D_I$ of ~20 mm).

Figure 13:
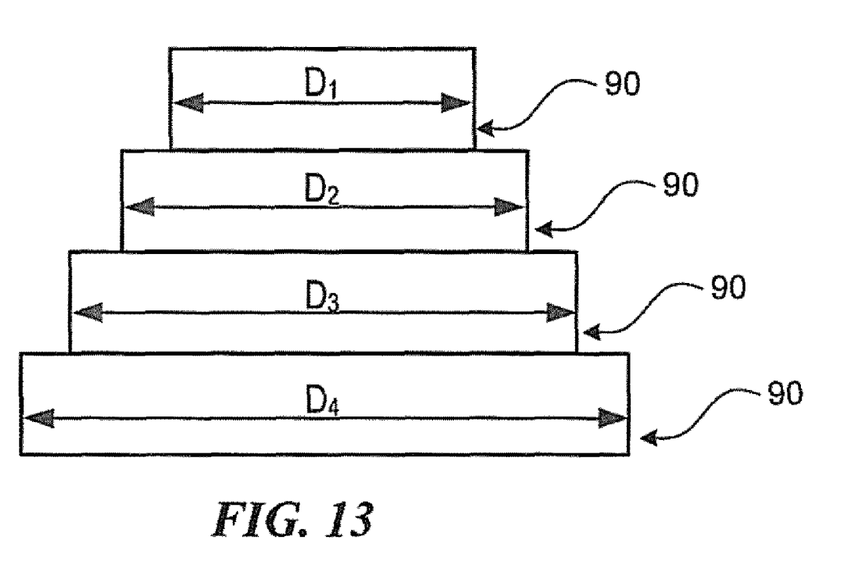

Stabilizers 74 may be formed having dimensions comparable to multiple spindles and/or shafts 60 as illustrated in FIG. 13. For example, stabilizer 74 may be formed in a stepped pattern with each step 90 providing a different diameter $D_{1-4}$. Using the stepped pattern, inner edge 62 of substrate 12 may be substantially fitted to at least one step 90 having a slightly smaller diameter $D_M$ than diameter $D_I$.

What is claimed is:

1. A method of patterning a substrate having an inner edge and inner diameter that is positionable about a shaft having an outer diameter and an axis of rotation, the method comprising:
    providing a template with a patterning surface having concentrically arrayed features, the template in superimposition with the substrate;
    determining the location of a first point on the inner edge of the substrate relative to the template;
    determining a radius difference based on the difference between the diameter of the shaft and the inner diameter of the substrate;
    biasing the substrate such that the first point of the substrate is translated relative to the template by the radius difference; and
    imprinting a patterned layer on the substrate with the template, wherein features of the patterned layer are imprinted such that they are concentric to the axis of rotation of the shaft when the outer diameter of the shaft is contacted with the first point of the substrate.

2. The method of claim 1, wherein the first point is determined using alignment marks.

3. The method of claim 1, wherein the inner diameter of the substrate is determined by a laser emitter and a photo-electric detector located above the substrate, wherein the photo-electric detector is positioned to receive light diffracted at an angle and provide a signal when a laser is incident on the substrate.

4. The method of claim 3, wherein the inner diameter of the substrate is determined by a change in the signal.

5. The method of claim 1, wherein features of the patterned layer are not concentrically imprinted about a center of the substrate.

6. The method of claim 1, wherein the shaft includes one or more stabilizers.

7. The method of claim 6, wherein the one or more stabilizers are movable.

8. The method of claim 6, wherein the stabilizers are placed adjacent to the inner edge of the substrate.

9. The method of claim 8, wherein the stabilizers provide for at least three points of contact on the substrate.

10. The method of claim 9, wherein at least two of the three points of contact are on the inner edge of the substrate.

11. The method of claim 9, wherein the three points of contact are on the inner edge of the substrate.

12. The method of claim 9, wherein at least one of the point of contact are is on an outer edge of the substrate.

13. The method of claim 6, wherein the stabilizers are integral to a substrate chuck, the substrate chuck holding the substrate during imprinting.

14. The method of claim 6, wherein the stabilizers are attachable to a substrate chuck, the substrate chuck holding the substrate during imprinting.

15. The method of claim 6, wherein positioning of the stabilizers is determined based on relative distance between each stabilizers and the first point.

16. The method of claim 15, wherein stabilizers are located equidistance from each other.

17. The method of claim 6, wherein the stabilizers are formed in a stepped pattern having multiple diameters.

* * * * *